United States Patent [19]
Sagues et al.

[11] Patent Number: 6,075,334
[45] Date of Patent: Jun. 13, 2000

[54] AUTOMATIC CALIBRATION SYSTEM FOR WAFER TRANSFER ROBOT

[75] Inventors: Paul Sagues, Ross; John T. Peurach, San Francisco; Sanjay D. Aggarwal, Berkeley, all of Calif.

[73] Assignee: Berkeley Process Control, Inc, Richmond, Calif.

[21] Appl. No.: 09/270,261

[22] Filed: Mar. 15, 1999

[51] Int. Cl.$^7$ ........................................................ B25J 9/18
[52] U.S. Cl. .............................. 318/568.11; 318/568.15; 318/568.16; 318/568.21; 318/570; 318/574; 414/744.6; 414/416
[58] Field of Search .......................... 318/568.11, 568.15, 318/568.16, 568.19, 568.21, 570, 574; 324/754; 414/744.6, 416

[56] References Cited

U.S. PATENT DOCUMENTS

| | | |
|---|---|---|
| 3,972,424 | 8/1976 | Levy et al. . |
| 3,986,109 | 10/1976 | Poduje . |
| 4,158,171 | 6/1979 | Abbe et al. . |
| 4,646,009 | 2/1987 | Mallory . |
| 4,692,695 | 9/1987 | Poduje . |
| 4,770,600 | 9/1988 | Ishikawa . |
| 4,775,281 | 10/1988 | Prentakis .................................. 414/416 |
| 4,819,167 | 4/1989 | Cheng et al. . |
| 4,846,626 | 7/1989 | Engelbrecht . |
| 4,860,229 | 8/1989 | Abbe et al. . |
| 4,880,348 | 11/1989 | Baker et al. . |
| 4,881,863 | 11/1989 | Braginsky . |
| 4,892,455 | 1/1990 | Hine . |
| 4,895,486 | 1/1990 | Baker et al. . |
| 4,897,015 | 1/1990 | Abbe et al. . |
| 4,910,453 | 3/1990 | Abbe et al. . |
| 4,931,962 | 6/1990 | Palleiko . |
| 4,955,780 | 9/1990 | Shimane et al. . |
| 4,958,129 | 9/1990 | Poduje et al. . |
| 4,980,971 | 1/1991 | Bartschat et al. . |
| 5,030,057 | 7/1991 | Nishi et al. . |
| 5,054,991 | 10/1991 | Kato . |
| 5,102,280 | 4/1992 | Poduje et al. . |
| 5,102,291 | 4/1992 | Hine . |
| 5,135,349 | 8/1992 | Lorenz et al. ........................ 414/744.6 |
| 5,193,969 | 3/1993 | Rush et al. . |
| 5,261,776 | 11/1993 | Burck et al. . |
| 5,265,170 | 11/1993 | Hine et al. . |
| 5,332,352 | 7/1994 | Poduje et al. . |
| 5,340,261 | 8/1994 | Oosawa et al. . |
| 5,386,481 | 1/1995 | Hine et al. . |
| 5,405,230 | 4/1995 | Ono et al. . |
| 5,456,561 | 10/1995 | Poduje et al. . |
| 5,466,945 | 11/1995 | Brickell et al. . |
| 5,520,501 | 5/1996 | Kouno et al. . |
| 5,540,821 | 7/1996 | Tepman . |
| 5,557,267 | 9/1996 | Poduje et al. . |
| 5,563,798 | 10/1996 | Berken et al. . |
| 5,564,889 | 10/1996 | Araki . |
| 5,642,298 | 6/1997 | Mallory et al. . |
| 5,655,871 | 8/1997 | Ishii et al. . |
| 5,668,452 | 9/1997 | Villarreal et al. . |
| 5,670,888 | 9/1997 | Cheng ........................................ 324/754 |
| 5,691,907 | 11/1997 | Resler et al. . |
| 5,740,062 | 4/1998 | Berken et al. . |
| 5,741,114 | 4/1998 | Onodera . |
| 5,743,695 | 4/1998 | Ryu . |
| 5,746,565 | 5/1998 | Tepolt . |
| 5,831,738 | 11/1998 | Hine . |
| B1 4,457,664 | 8/1993 | Judell et al. . |

Primary Examiner—Karen Masih
Attorney, Agent, or Firm—Owen, Wickersham & Erickson, P.C.

[57] ABSTRACT

A system for automatically calibrating a semiconductor wafer handling robot so that the robot will move wafers into and out of precise locations within enclosures that form process stations or storage cassettes is disclosed. The system comprises a controller having memory and logic sections connected to a robot having an articulated arm that is movable in vertical (Z), horizontal (θ), and radial (R) directions and having a wafer retaining wand at the end of the arm. Dimensional characteristics of the robot wand and the enclosures are stored in the controller memory. Sensors are provided at each enclosure and/or the robot wand which are activated and provide signals to the controller that are relative to the wand position. The robot is programmed to execute a series of progressive movements at each enclosure location which are controlled by a combination of sensor response signals and the appropriate dimensional characteristics. At the end of the programmed movements, the robot wand is positioned within a process station or cassette so that it can engage for removal or release a wafer therein at a precise predetermined location.

18 Claims, 12 Drawing Sheets

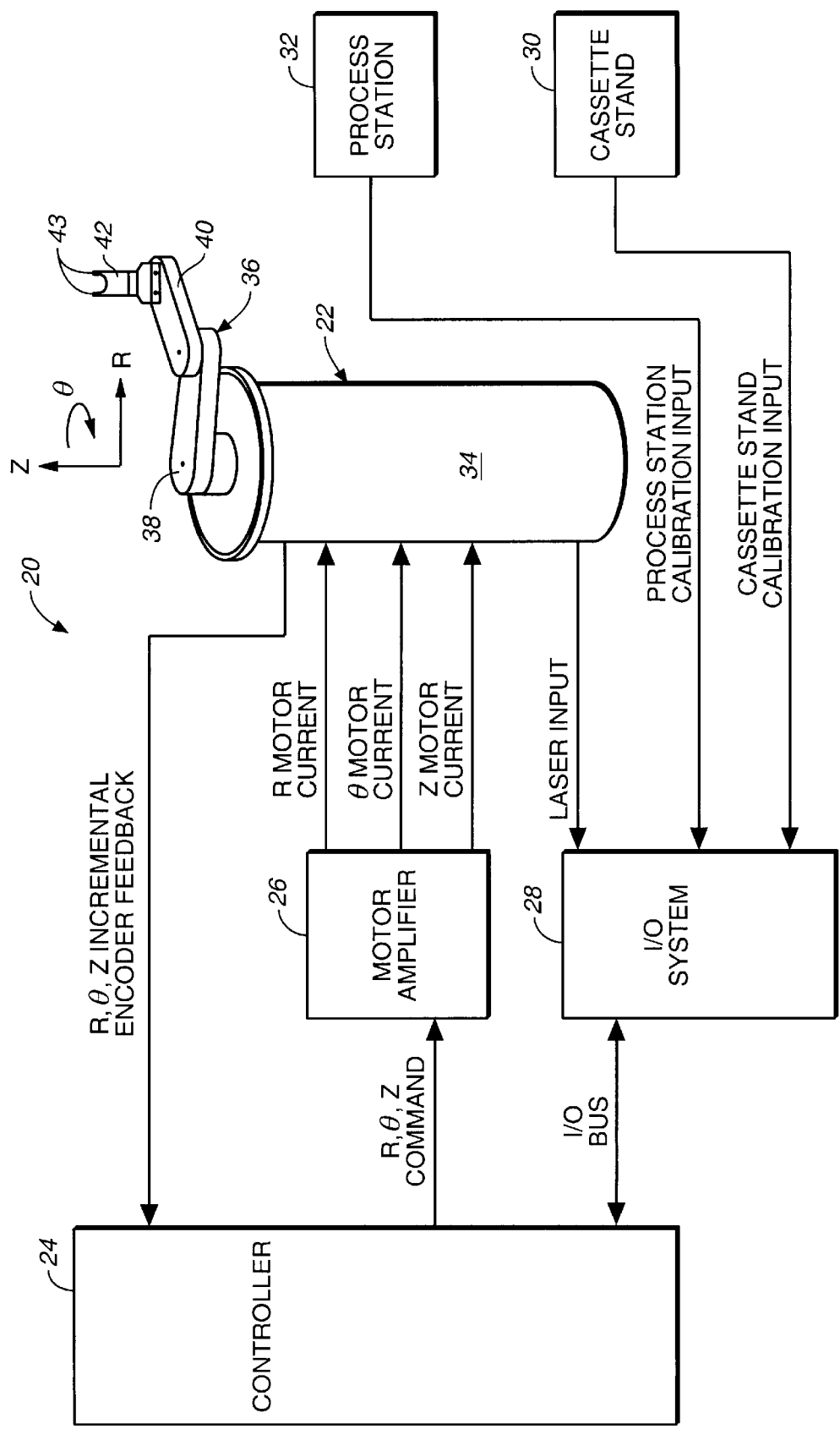
FIG._1

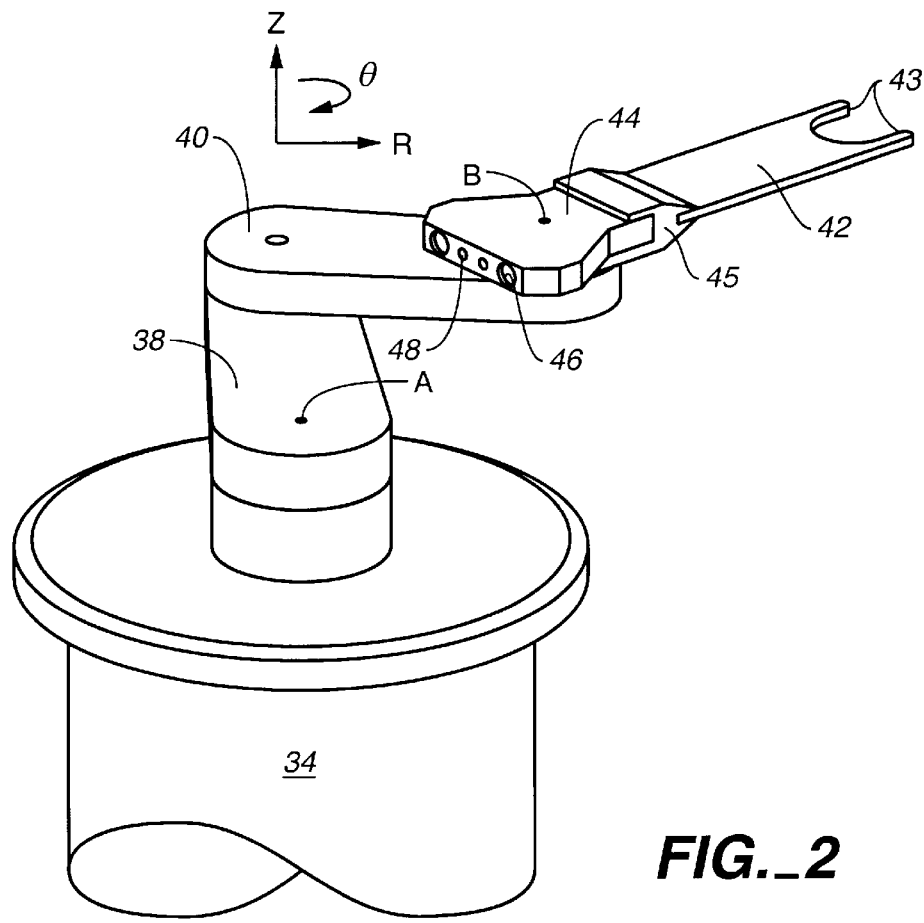
FIG._2
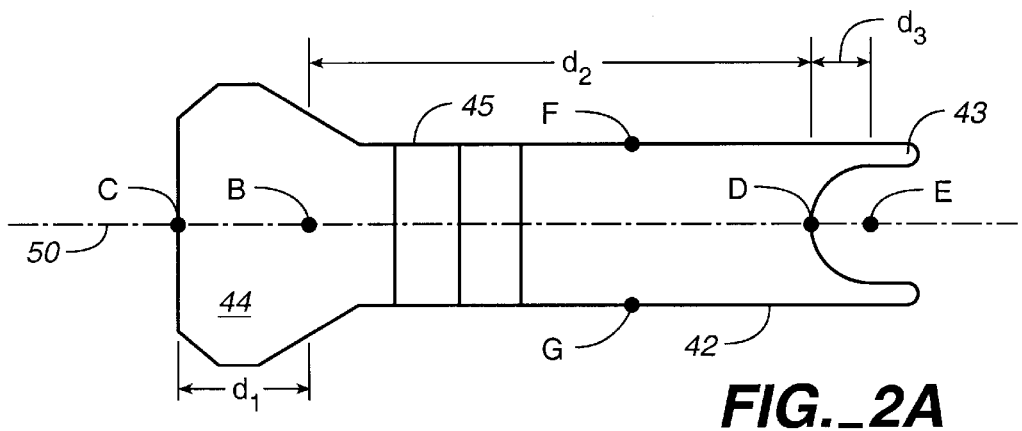
FIG._2A
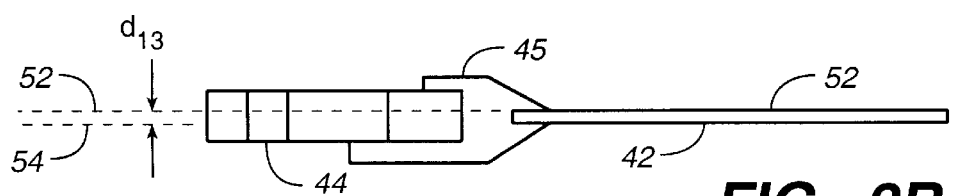
FIG._2B

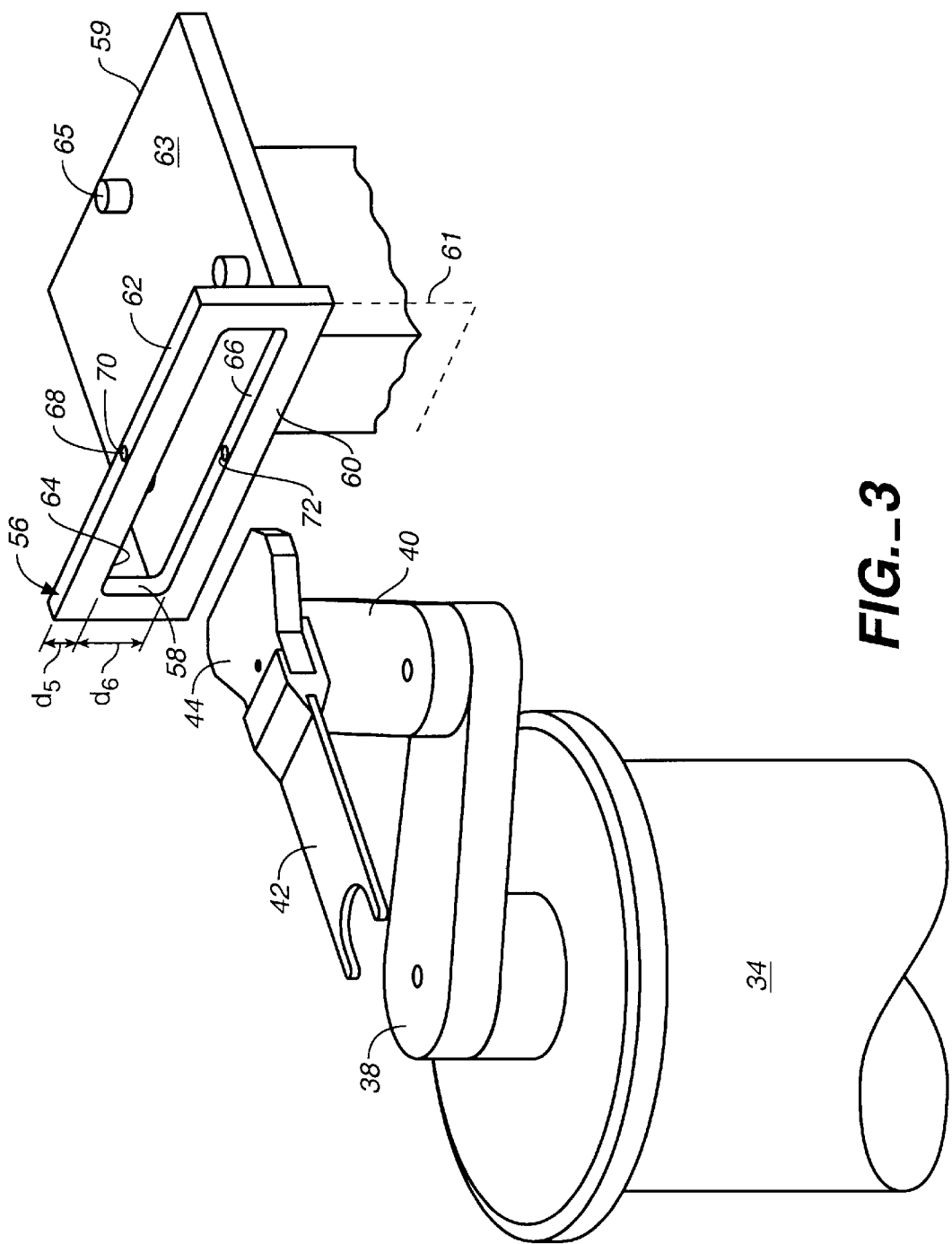
FIG._3

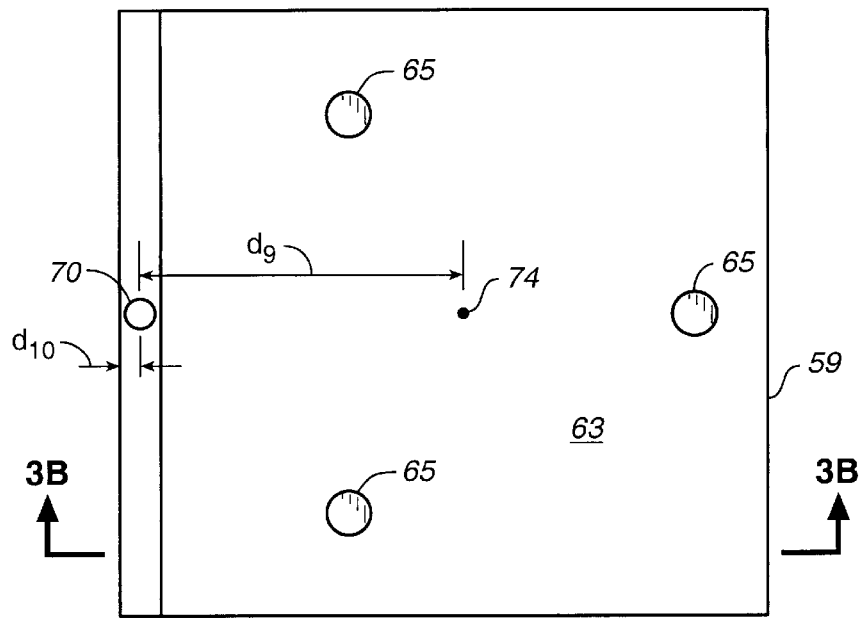
FIG._3A
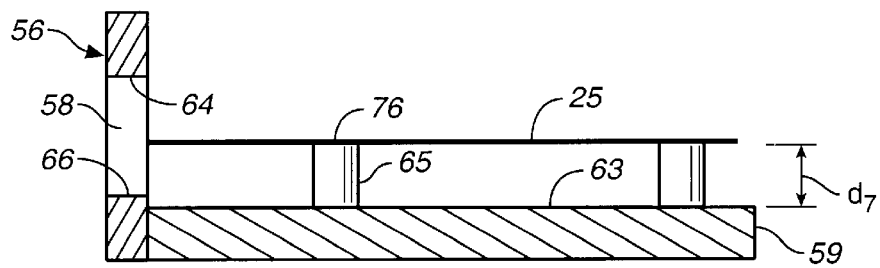
FIG._3B
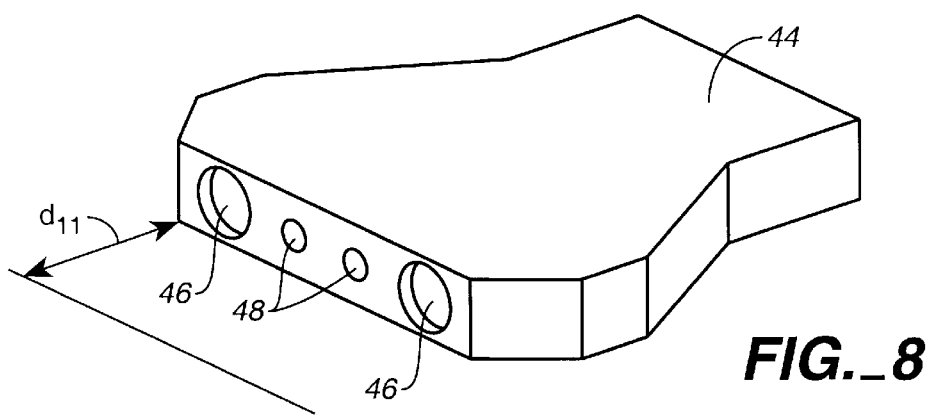
FIG._8

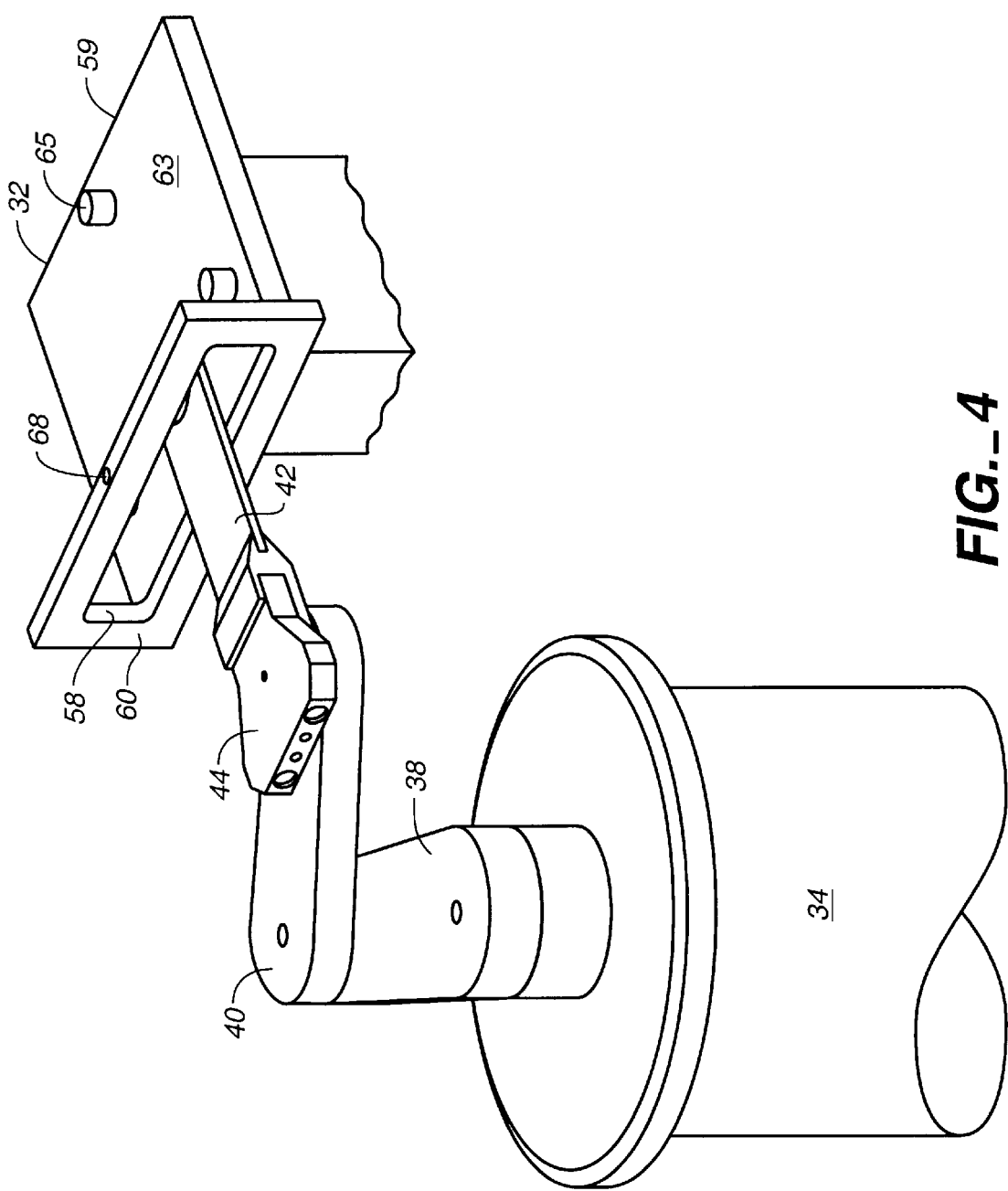
FIG._4

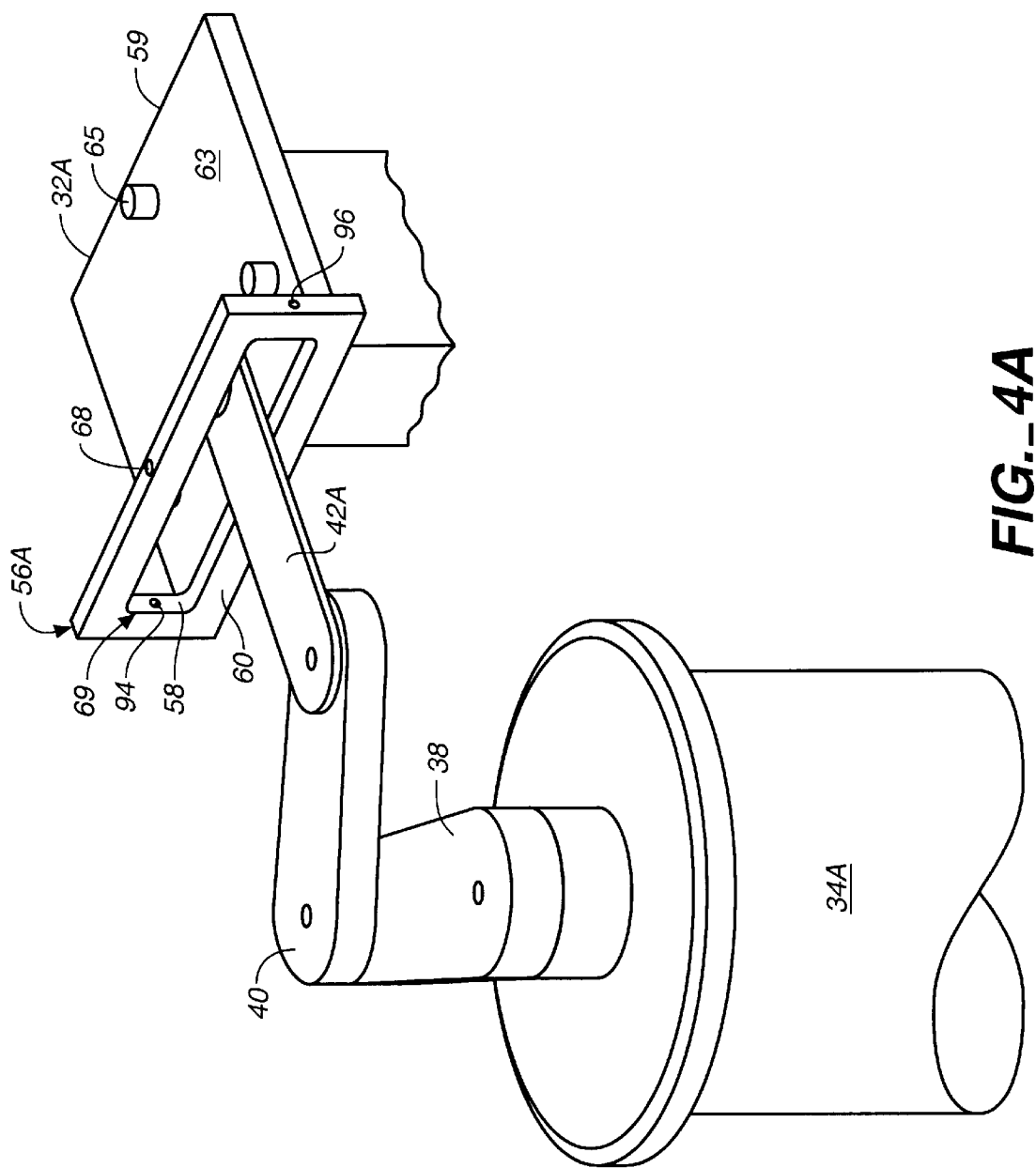
FIG._4A

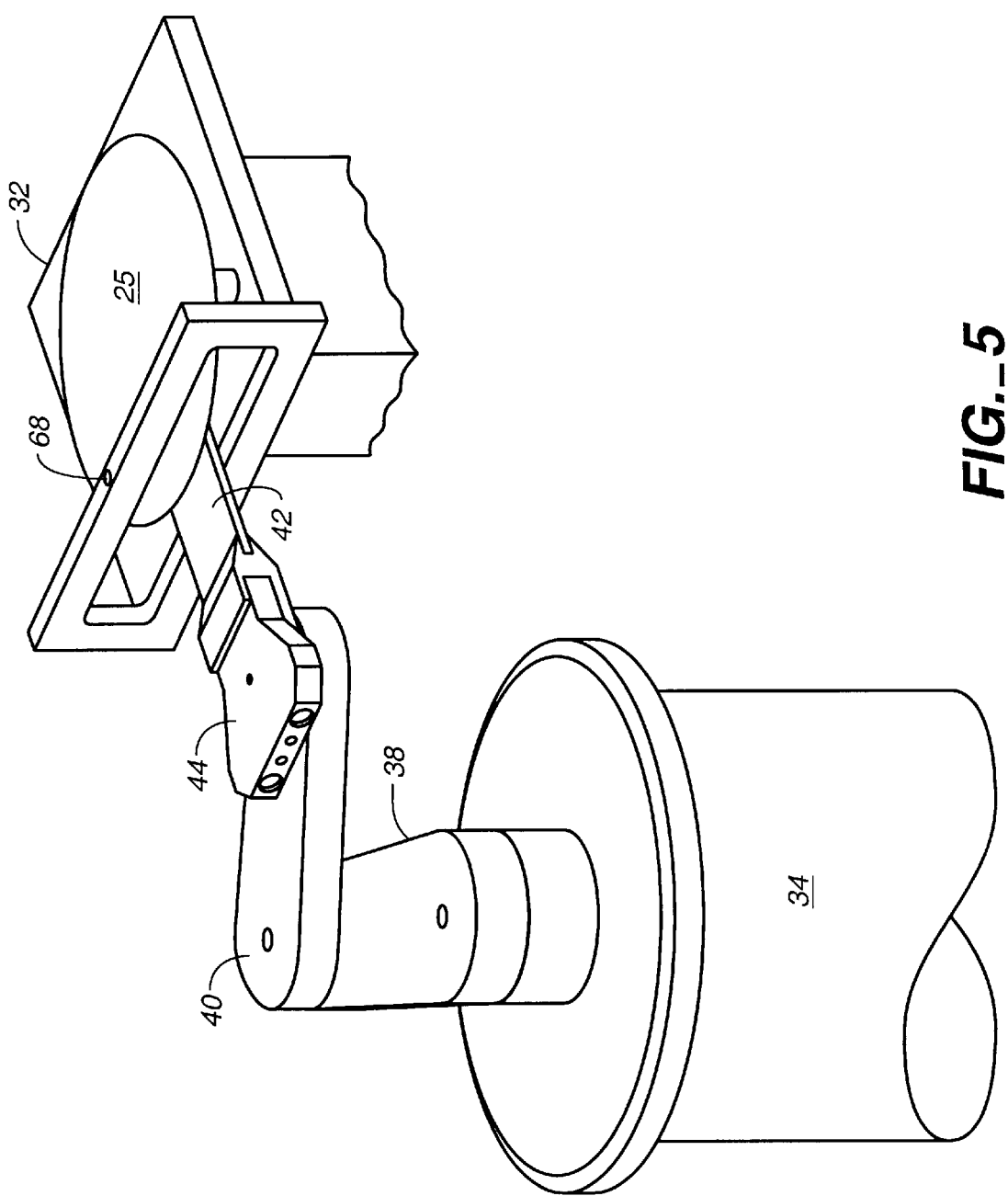
FIG._5

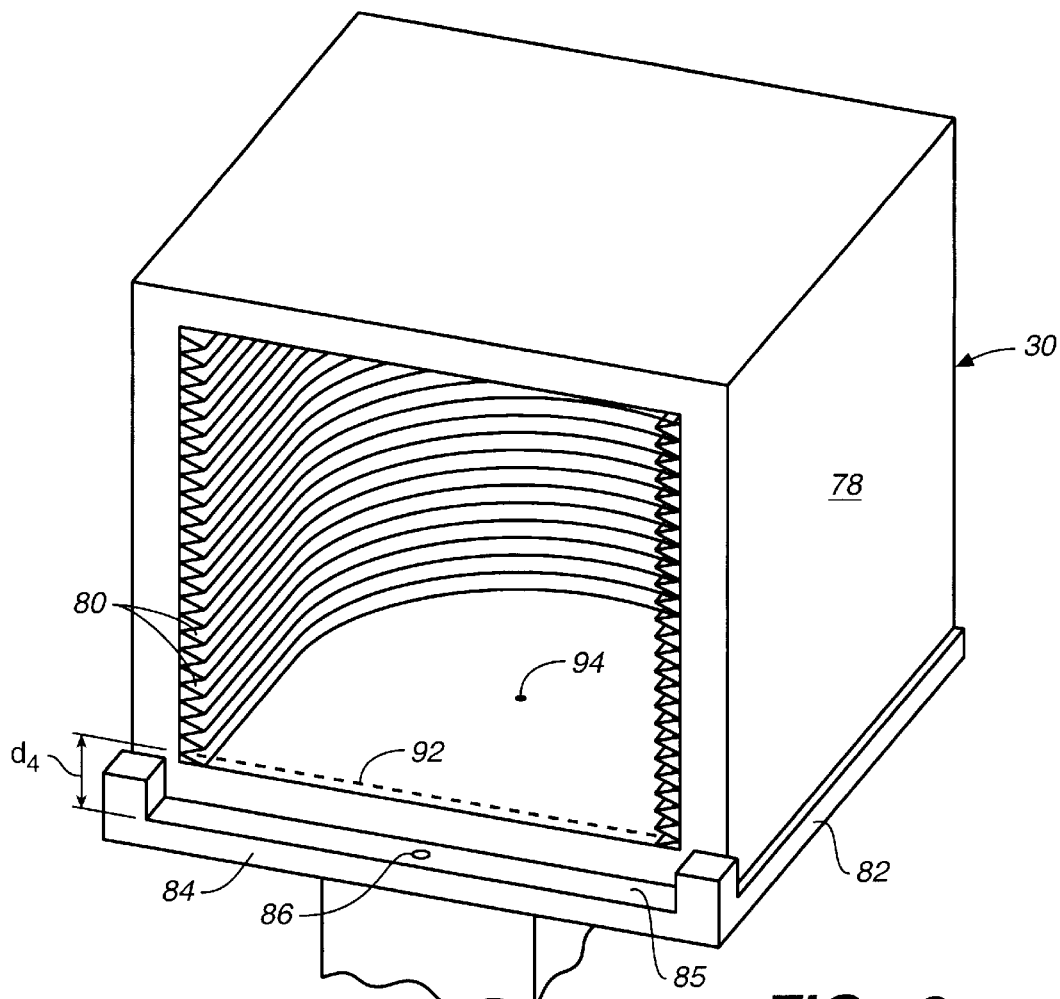
FIG._6
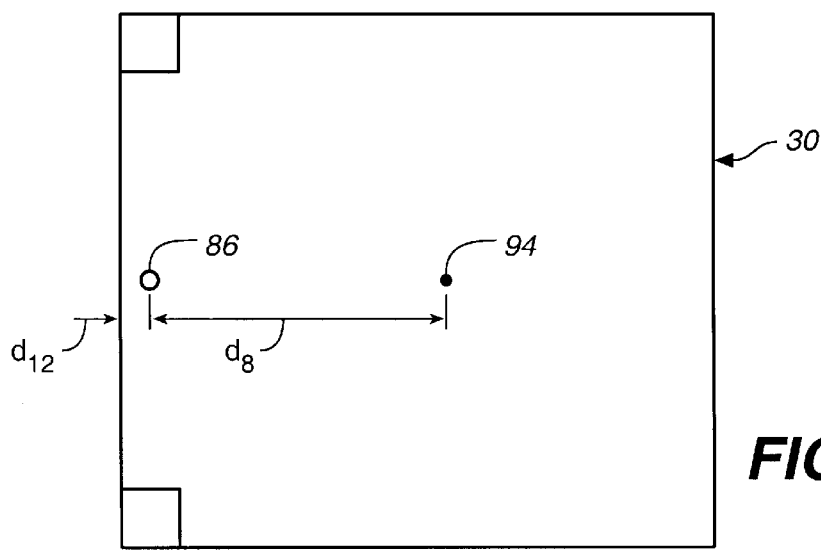
FIG._6A

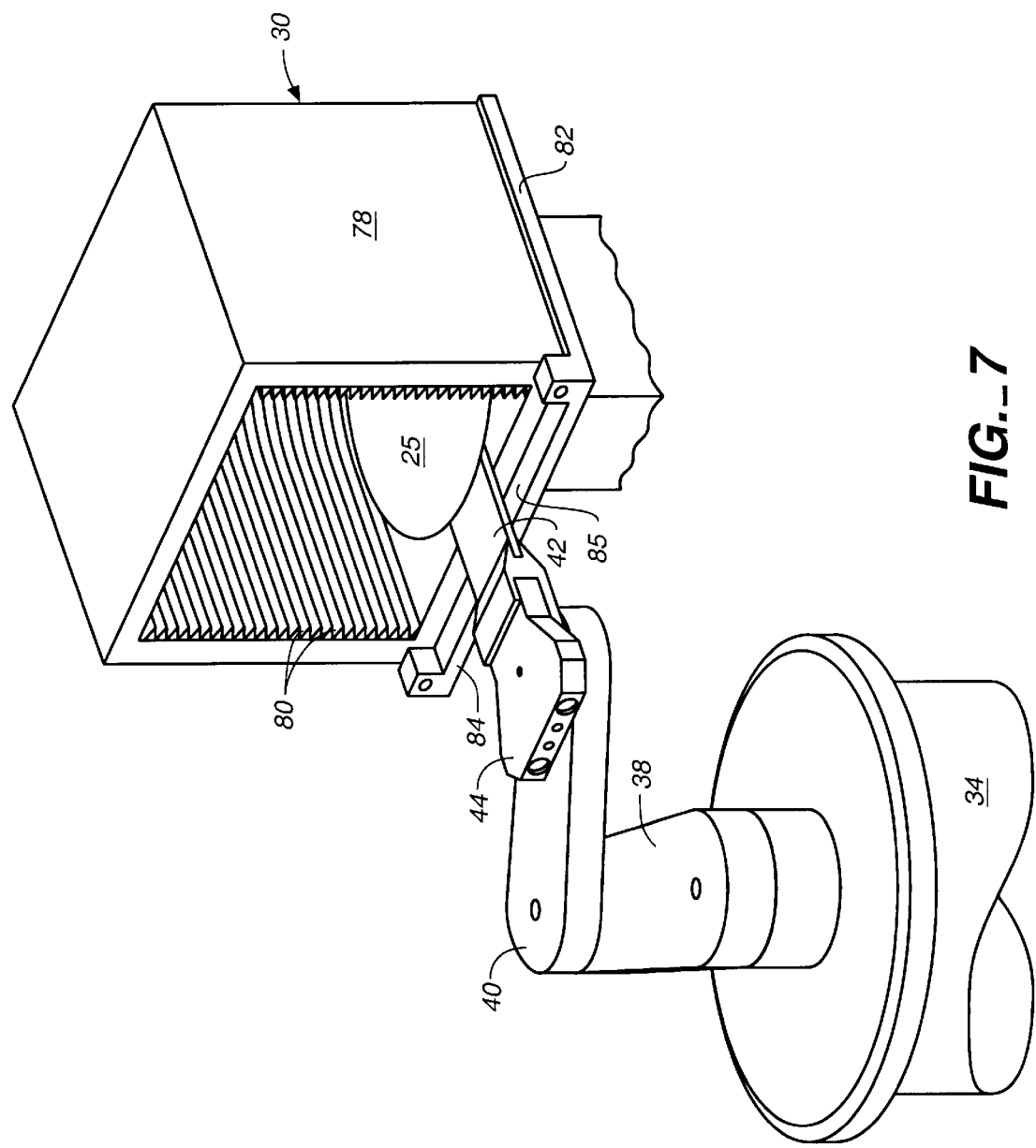
FIG._7

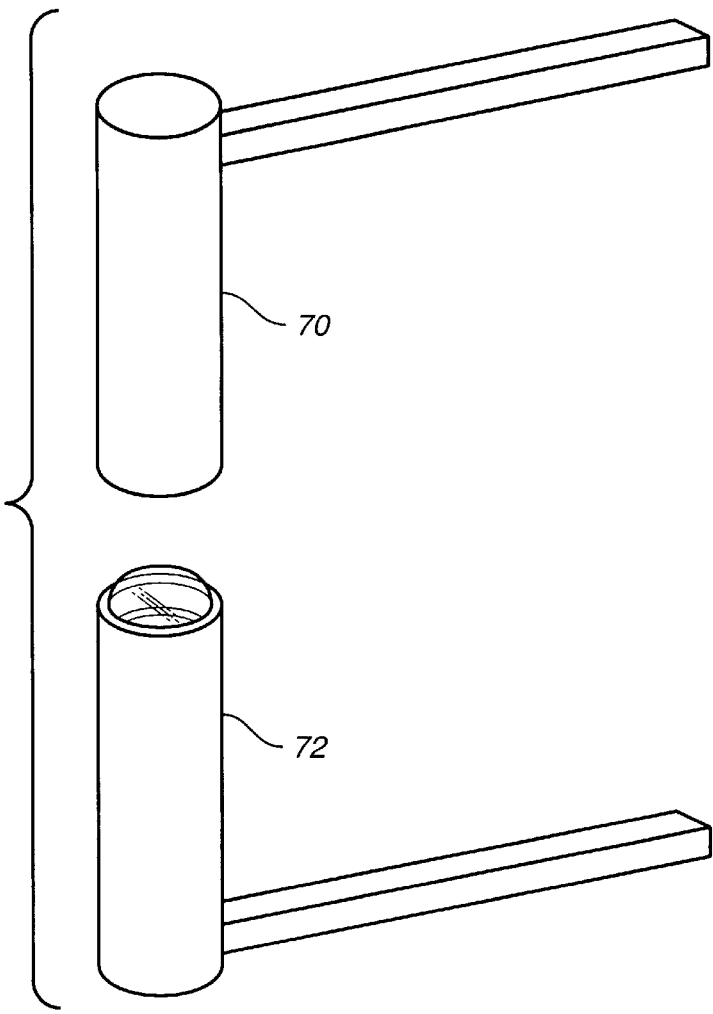
FIG._9
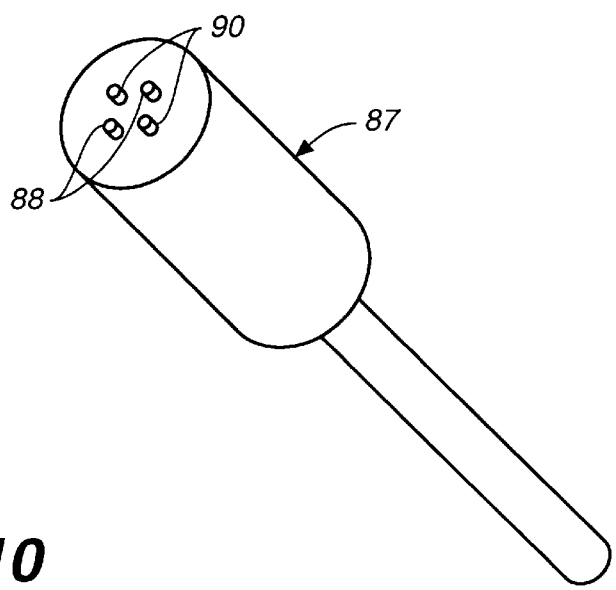
FIG._10

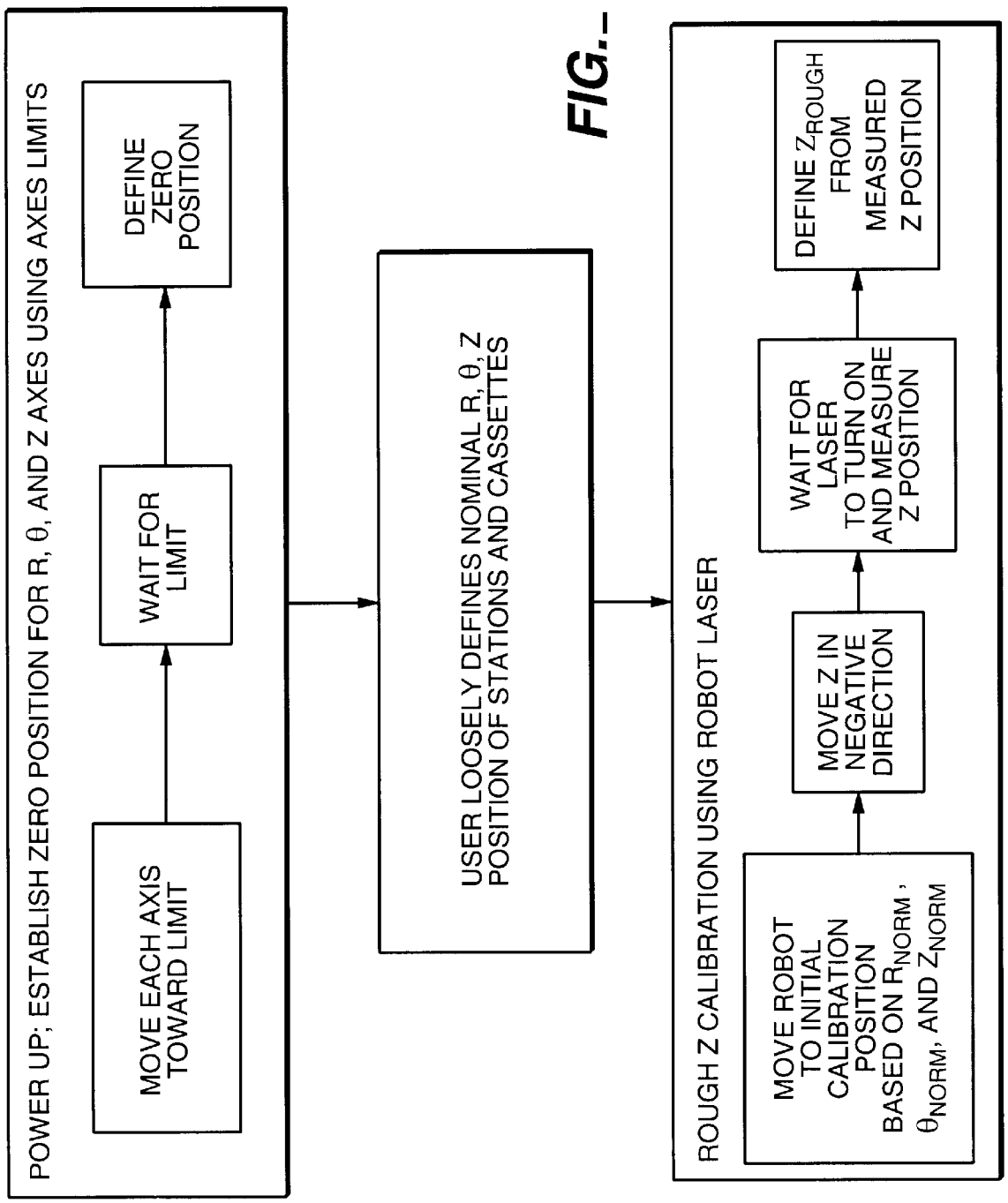

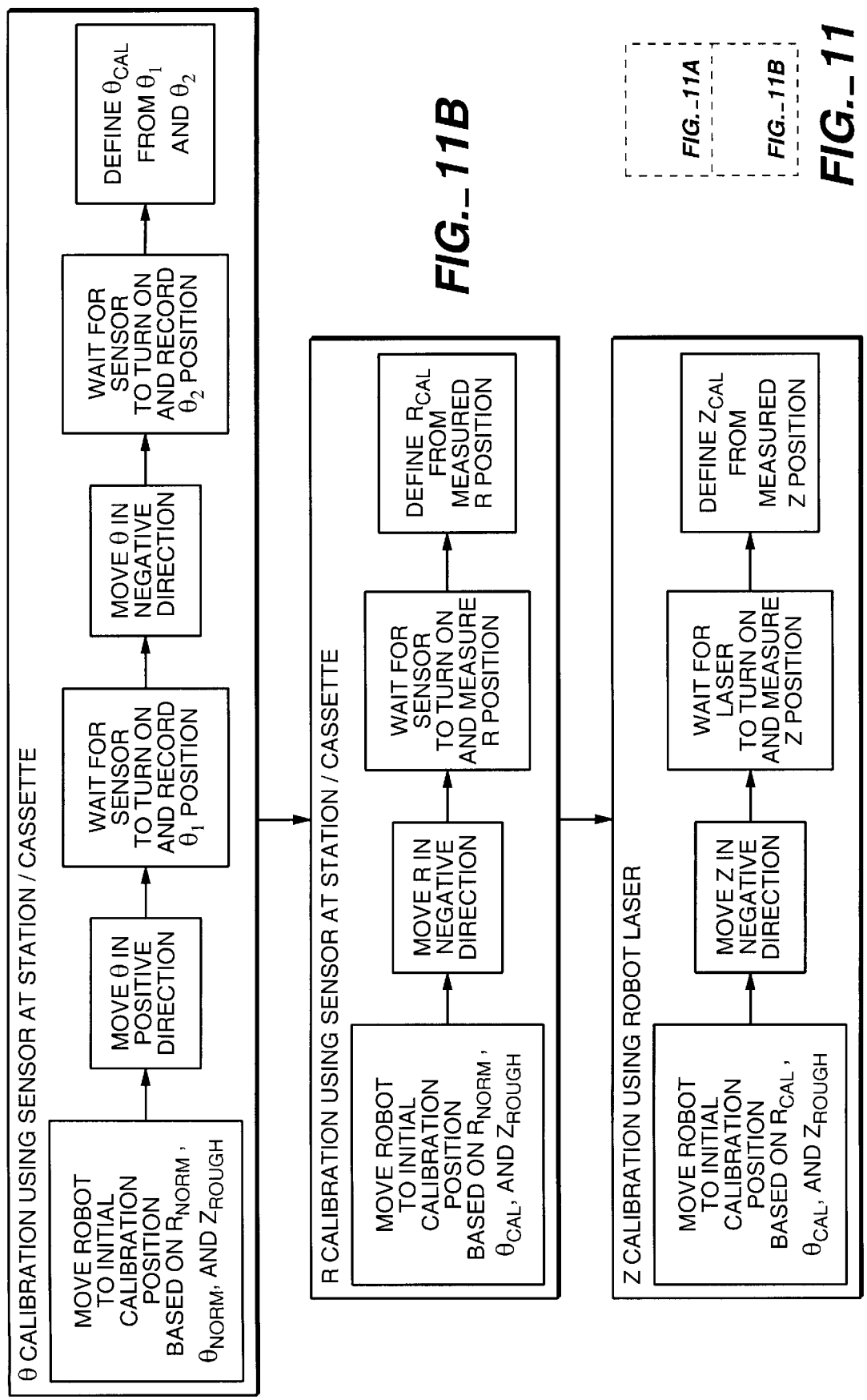

6,075,334

AUTOMATIC CALIBRATION SYSTEM FOR WAFER TRANSFER ROBOT

This invention relates to control systems for robots, and more particularly to a method and apparatus for automatically calibrating or "teaching" a robot to position itself at a plurality of pre-selected positions.

BACKGROUND OF THE INVENTION

In the fabrication of semiconductors, silicon wafers are held in a cassette and then moved to various pre-programmed processing locations by a robotic handling system. The latter typically includes a mechanism with degrees of freedom in radial (R), angular (θ) and vertical (Z) directions and having a robot arm with a vacuum or edge-gripping wand. The robot must be able to pick up wafers from a storage cassette and then transfer them to a designated station or a plurality of stations where the wafer will undergo some arbitrary process such as heating or alignment. In order to perform these actions, the robot must have precise knowledge of the R, θ and Z positions of the wafer at all cassette and station locations. A robot control system must provide the aforesaid knowledge to position the robot arm and thus the gripped wafer precisely within a cassette or process station for each robot function.

To provide proper operation of the robot system when initially set up or when restarted after replacement of a component or when a process location has been changed, the robot must be programmed or "taught" so that for each operation phase, the robot arm is positioned precisely at the proper location for the desired function. Heretofore, this initial and/or subsequent programming or "teaching" step was accomplished by trained personnel using visually estimated trial and error adjustments of the robot mechanism and control.

For example, using conventional controls, a robot was heretofore installed and "taught" by jogging the robot around and, at each process station, recording wafer placement locations with a teach pendant. Besides consuming many hours, this manual procedure introduced subjectivity and thus a significant possibility for errors since no two technicians could set the same positions. This created a problem of reproductivity, that is, of setting the robot in a precise predetermined position for each of a multitude of cycles. Whenever a wafer cassette is not perfectly positioned within specifications or a machine component wears or malfunctions and requires replacement, the robot must be re-taught because it cannot adapt to such variations. If the robot is not re-taught properly within close tolerances, serious damage or loss of expensive wafers could result.

It is therefor a general object of the present invention to provide a method and apparatus for automatically calibrating or teaching a wafer handling robot in conjunction with its control system so that it will operate reliably with reproducibility for a multitude of cycles and within close tolerances to manipulate wafers from cassette holders to various process stations without any damage to wafers.

Further objects of the invention are to provide a wafer-handling automatic calibration system that will automatically calibrate and adjust a wafer handling robot in a relatively short time, for example, after robot components have been removed and replaced.

Another object of the invention is to provide an automatic calibration system for a wafer handling robot which utilizes a machine controller that is programmed to utilize known dimensional data as well as sensor inputs from the robot and the process stations to control robot movements to precise wafer contacting locations.

Still another object of the invention is to provide a robotic wafer handling system having improved reproducibility of the position of the wafer holding wand in the locale where a semiconductor wafer is placed or removed from an enclosure by virtue of the known dimensional data of the wand and enclosure as well as sensor inputs from the robot and the process stations to control robot movement to precise wafer contacting locations.

SUMMARY OF THE INVENTION

The aforesaid objects are accomplished by an automatic calibration system for a robotic wafer handling apparatus comprised of a robot with three degrees of freedom in the radial (R), angular (θ), and vertical (Z) directions. The robot, which is connected to a machine controller having a memory section and logic circuitry, has a movable robot arm which can be extended to reach a preselected location such as a cassette containing semiconductor wafers and one or more of a plurality of processing stations. Throughout this application, the term "processing station" may include wafer holding boats or cassettes, or any enclosure of fixture which is adapted to retain a wafer or disc for some processing purpose. At the outer end of the robot arm is a wand having a wafer engaging and retaining means such as an edge grip device or a vacuum port that enables it to pick-up, place and transport wafers from and to cassettes and to process stations where the wafer will undergo some arbitrary process such as heating or alignment. In order to perform these actions, the robot must have precise knowledge of the R, θ and Z positions at which to pick-up and place wafers at both locations. The present invention provides a means for automatically determining or calibrating the various required robot positions with no operator intervention.

The controller has a memory section which is supplied with initial data including nominal R, θ and Z pick-up and drop off positions of the wafers at the process stations and cassettes of the system. Also, the controller memory is provided with vital dimensional characteristics of the robot and the process stations and cassettes that are serviced by the robot. The controller is connected to an I/O system which receives sensor signals from the robot arm, the process stations and cassettes as well as from the robot motors.

The robot which may be of a commercially available type, consists of three motors (R, θ and Z), a vacuum solenoid valve, a vacuum present sensor or edge gripping means, an R axis home switch, and preferably, a laser sensor. As the robot's Z axis motor moves, the entire robot arm translates along the Z axis (see FIG. 1). The θ axis motor causes the entire arm to rotate about point A in an angular θ direction. The R axis motor causes the arm to extend radially out along the R axis such that the wand is still along the centerline of the robot through a point A, but further or closer to point A.

The machine controller is programmed to move each of the motors to a commanded position and to process the I/O data. For the motors, encoders provide feedback signals to the controller to indicate the current position of the motor. The encoder data is stored in the memory of the controller at regular intervals. Based on the actual motor feedback position and the desired motor position (i.e., the commanded motor position), which is determined by the software in the controller, a feedback loop within the controller produces the voltage outputs required to move the motors to their desired positions. These voltage outputs are sent to the motors via the amplifier. Since the motors are actually run by changing the current to the motor, an amplifier in the controller converts the voltage output to the appropriate current output.

In the addition to the motor movements, the controller collects I/O data from the I/O system. At regular intervals, the controller stores digital input point states (i.e. On or Off signals) from the I/O system in its own memory and sends digital output states from its memory to the I/O system. The I/O system collects the input point states of each of the input devices (e.g., a vacuum present sensor) and sends the output point states to the appropriate output devices (e.g. vacuum solenoid valve). The I/O system coordinates the signal paths so that the device states go to the correct memory locations in the controller.

In one autocalibration system according to the invention, three types of sensors are used. The first is a twin beam laser sensor attached to the back of the wand on the robot arm which provides a digital output depending on whether the emitted laser is reflected back from an object and sensed at the receiver. Thus, it will only be sensed if there is an object in front of the sensor which can reflect the laser back to the sensor, and it has an optimum scanning distance with some limited range of operation.

The second type of sensor is a thrubeam sensor which is used on the process station. Like the laser sensor on the robot, this sensor has a sender/receiver component pair which are aligned vertically at a process station and provide a digital output depending on whether the receiver senses the infrared LED signal from the sender. Thus, this sensor detects when an object such as the robot wand is moved horizontally between the sender/receiver beam.

The third sensor type is a reflective LED sensor which is similar to the thrubeam sensor except that its sender and receiver are contained in the same unit (see FIG. 8). This sensor can determine when an object is placed in front of it by detecting the reflected light signal. Such a sensor is provided on the cassette to determine the final R value of the robot for contacting a wafer in the cassette.

A typical autocalibration procedure for a process station according to the invention is accomplished broadly, as follows:

With the controller properly programmed, including designation of nominal R, $\theta$ and Z positions of all stations and cassettes, the operator must only press a "Start" button. The controller first commands the robot to move into a position where the robot sensor laser can perform a rough Z-direction scan of the vertical reference plane on the process station. Thus, the robot is moved to an initial or nominal calibration position based on Rnom, $\theta$nom, and Znom. The wand is first rotated to its reverse $\theta$ position so that its sensor faces the targeted process station. The robot with the wand is moved in a negative Z position until the laser is turned on to define a Z rough position. The controller then commands the robot to establish the $\theta$ calibration using the vertically oriented sensor located at the process station or cassette. The robot is moved to an initial calibration position based on Rnom, $\theta$nom and Zrough. The robot is moved in a positive $\theta$ direction until the sensor is turned on and records a $\theta$ position. The robot is then moved in a negative $\theta$ direction until another sensor is turned on to indicate a second $e_2$ position. The $\theta_1$ and $\theta_2$ positions represent opposite side edges of the wand. The calibrated $\theta_{cal}$ position is now calculated by dividing $\theta$, and $\theta e_2$ values by 2.

The controller now commands the robot to proceed with the R calibration by moving it to an initial calibration position based on $R_{nom}$ $\theta_{cal}$ and $Z_{rough}$. The robot arm is moved in the R direction until the process station sensor is activated to define the measured R position. Now, the final Z calibration is accomplished as the controller moves the robot to an initial calibration position based on Rcal, $\theta$cal, and $Z_{rough}$. Here, the robot is again moved in the negative Z direction with the wand reversed and its sensor facing the vertical plane of the process stations or cassette opening at its optimum scanning distance. As the edge of the opening is encountered, the wand sensor is triggered to define the measured Z position.

The controller can be programmed to accommodate a large number of cassettes or process stations that are within the reach or scope of the connected robot. For each stations or cassette a precise movement of the robot arm can be controlled so that contact, support and transport of the targeted semiconductor wafer can be accomplished with reliability and maximum efficiency.

In the aforesaid procedure the laser sensor on the rotatable wand of the robot is also used for mapping a cassette to provide an indication of the presence of wafers in the cassette. In wafer handling systems where this mapping function is not required, a robot without the wand sensor may be used in a modified form of the invention. Here, an additional horizontal beam sensor is provided in the opening of each process station to enable the Z position of the robot to be calibrated.

Other objects, advantages and features of the invention will become apparent from the following detailed description of embodiments presented in conjunction with the accompanying drawing.

BRIEF DESCRIPTION OF THE DRAWINGS

FIG. 1 is a diagrammatic view of a wafer handling robot system that provides autocalibration in accordance with the principles of the present invention.

FIG. 2 is a fragmentary view in perspective of the robot for the system of FIG. 1.

FIG. 2A is a plan view of the wafer contacting wand for the robot of FIG. 2.

FIG. 2B is a side view in elevation of the robot wand of FIG. 2.

FIG. 3 is a fragmentary view in perspective of the robot of FIG. 2 and a process station as it appears with its wand in reverse position during a preliminary sensing step before entering the process station.

FIG. 3A is a plan view of a typical process station as shown in FIG. 3.

FIG. 3B is a side view in elevation of the process station of FIG. 3A.

FIG. 4 is a view in perspective similar to FIG. 3 and showing the robot wand extending partially within the process station.

FIG. 4A is a view in perspective showing an alternate form of the invention with a modified sensor arrangement.

FIG. 5 is a view in perspective similar to FIG. 4 showing the robot wand fully within the process station and in contact with a wafer therein.

FIG. 6 is a view in perspective of a typical cassette holder for semiconductor wafers.

FIG. 6A is a slightly reduced horizontal plan view of the cassette holder of FIG. 6.

FIG. 7 is a view in perspective showing the robot of FIG. 2 as it appears extended with its wand in contact with a wafer within the cassette holder of FIG. 6.

FIG. 8 is an enlarged view in perspective of the sensor that is mounted on the robot wand.

FIG. 9 is an enlarged exploded view of the transmitter and receiver elements of a thrubeam sensor that is used on the process station.

FIG. 10 is an enlarged view in perspective of a sensor used on the cassette shown in FIG. 6.

FIGS. 11A and 11B constitute a flow chart showing the functional steps for accomplishing the autocalibration of the robot shown in FIG. 1, according to the invention.

DETAILED DESCRIPTION OF EMBODIMENT

With reference to the drawing, FIG. 1 shows diagrammatically a semiconductor wafer handling apparatus 20 including a robot 22 that utilizes an autocalibration system embodying principles of the present invention. The robot is electrically connected to a machine controller 24, a motor amplifier 26 and an I/O component 28. In accordance with the invention, the robot is automatically controlled to locate and move to precise locations which enable it to remove or replace wafers from one or more storage devices such as a boat or cassette stand 30 and to and from one or more process stations 32. As shown, electrical connections from a cassette and from a process station furnish sensor signals to the I/O component 28. The semiconductor wafers referred to above and identified by numeral 25 in the drawing may be any form of semiconductor wafer having a uniform thickness and diameter.

The robot 22 has three degrees of movement in the radial (R), angular or theta (θ) and vertical directions. Generally, it comprises a base support 34 from which is cantilevered an articulated robot arm 36. The latter is comprised of a first robot arm section 38 to the end of which is a second pivotally connected outer arm section 40. Pivotally attached to the outer arm section 40 is a wand 42 whose outer end is generally Y-shaped with spaced apart wand fingers 43. Vacuum ports (not shown) are provided on the wand which enable it to retain a wafer in order to pick up and transport the wafer from a cassette to a process stations and vice-versa. Within the base support of the robot are three motors (not shown) that control the movement of the wand 42 in the three axes (R, θ and Z). Details of the drive connections for these motors are not shown since they are well known to those skilled in the art. The robot 22 is of a type that is commercially available and also has a vacuum solenoid valve, a vacuum present sensor, and an R axis home switch. As the robot's Z axis motor moves, the entire robot arm 36 translates vertically along the Z axis. The theta axis motor causes the arm 36 to move angularly about the Z axis and the R motor causes the wand 42 to move along the R axis that extends radially from a point A at the centerline of the robot.

A more detailed view of the robot 22 and its wand 42 is shown in FIG. 2. The point A which is on the Z axis of the robot and a point B which is on the pivotal axis of the second arm 40 and the wand 42, establish the R axis. Mounted on the rear end of the wand by a retainer 45 is a laser sensor 44 which is preferably of the twin beam reflective type. The embodiment shown (See FIG. 8) has two spaced apart laser emitters 46 and two laser sensor receiver elements 48 and it provides a digital output whenever a reflected laser is sensed at a receiver element. Thus, this laser 44 will only produce an output signal if there is an object in front of the sensor which can reflect the laser back to the sensor. This laser sensor has an optimum scanning distance $d_{11}$ (see FIG. 8) with a limited range of operation.

As shown in FIG. 2A, the point B is located on a longitudinal centerline 50 of the wand. Also on this centerline is point C on the outer edge of the sensor 44, point D which is on the wand edge between the wand fingers 43 and point E which is the optimum wafer pick-up center, also between the wand fingers. As shown, the distances between points C and E are important dimensions in the autocalibration procedure and are stored in the memory of the controller 24. Also, on opposite side edges of the wand 42 are points F and G which are utilized in the theta position measurements.

As shown in FIG. 2B another important dimension which is stored in the controller memory is the laser/wand offset ($LW_{OFF}$) or $d_{13}$. This is the distance between the top wafer-contacting plane 52 of the wand and the plane 54 of the laser emitters in the sensor 44. The top wafer plane 52 is co-planar with the upper edge of the beam from the laser emitters.

Turning to FIG. 3, the wand 42, is shown, pivotally mounted at the end of the outer arm 40 and in its reversed 180° position. In this position the sensor 44 can face a process station 32 as it commences its scanning procedure which will be described below. The process station, as shown, is representative of various types and forms used for different semiconductor processing steps and generally has a frame 56 forming a frontal opening 58 whose outer surface 60 is in a vertical reference plane 61. The frame 56 has a top outer edge 62, and top and bottom inner edges 64 and 66 of the opening 58. The distance $d_5$ between edges 62 and 64 and the distance $d_6$ between edges 64 and 64 are also stored in the memory of the controller. Attached to the base member 59 are three spaced apart wafer-supporting pins 65 of equal height which positioned to retain a wafer above the surface 63 while it is being processed. The frame is fixed to a horizontal base member 59 having a horizontally planar upper surface 63.

In this embodiment the process station 32 is provided with a laser sensor 68 which is mounted in the frame 56 the surrounds the opening 58. This sensor is thrubeam type sensor, of the type shown in FIG. 9 and comprises an emitter element 70 in the upper frame portion which transmits a laser beam to a vertically aligned receiver element 72 in the lower frame portion. When the beam between these two elements is blocked, a sensor signal is generated. A centerpoint 74 of the process station 32, as shown in FIG. 3A denotes the desired center of the wafer which is placed within the process station. The distance from centerpoint 74 to the sensor elements 70 and 72 is designated as $d_9$. A shorter distance designated as $d_{10}$ extends from the sensor 68 to the outer surface or reference plane 61 of the process station 32. The values for $d_9$ and $d_{10}$ are also stored in the controller memory.

As shown in FIG. 3B, the desired pick up height of the wafer, shown by the horizontal line 76, is a distance $d_7$ above the horizontal plane of the process station base member 59 provided by the pins 65. This $d_7$ value is also stored in the computer memory and is used later in determining the final Z position for the wand 42.

A typical wafer holding cassette 30 is shown in FIG. 6 and comprises essentially a housing 78 with an open front and a series of curved interior grooves 80 forming slots between them for retaining circular wafers. The housing is attached to a base 82 with a frontal member 84 that supports a sensor 86 which is located at a midpoint of the frontal member 84. The sensor 86, is preferably of the reflective LED type, as shown in FIG. 10. This sensor operates like the thrubeam sensor except that sender and receiver elements 88 and 90 are contained in the same unit and in use they can determine when an object is placed in front of them by detecting the reflected light signal. As with the other sensors, the sensor 86 provides signals to the I/O unit 28 which is connected to the controller 24. The sensor is flush with the upper surface 85 of the frontal element and is directed vertically upward. As indicated in FIG. 6, a distance $d_4$ extends above the upper surface 85 of the frontal member 84 and the sensor 86 to the plane of a wafer, shown as dotted line 92, that may be placed in the lowermost slot 80 of the cassette 30. The distance $d_4$ as well as the spacing of the slots above the sensor are stored in the controller memory. As shown diagrammatically in FIG. 6A the sensor 86 in the frontal element 84 is spaced inwardly from its outer edge by a distance $d_{12}$. Also, the distance from sensor 86 to the nominal centerline 94 of the wafers to be stored in the cassette 30 is designated as $d_8$. These distances $d_8$ and $d_{12}$ are also stored in the controller memory as previously described for other dimensions.

The Autocalibration Procedure

On initial power-up of the system, the operator initiates a homing procedure in which each of the robot motors is moved to a limit to define the zero position of the motor. This procedure is predefined by the software in the controller. The Z axis is commanded by the controller to move in the negative direction until a mechanical hard limit is reached. The position where the limit is detected (i.e., the motor will no longer move in the negative direction) is defined by the controller as the zero position for the Z axis motor. On the R axis, the R axis home switch is used to define the limit. This home switch is located mechanically within the robot so that when the R axis motor passes a specific mechanical location, the state of the R axis home switch changes from 'on' to 'off' (this signal is sent to the controller 24 via the I/O system 28). The controller moves the R axis until the home switch state change is detected. When the state changes, the controller captures the position and defines the position as some predefined offset relative to zero. Zero on the R axis is defined to be the position where the distance from A to B is zero (see FIG. 2). The theta axis zero position is defined relative to a mechanical hard limit in the same way as the Z axis.

After the power up procedure is complete, the operator can initiate the autocalibration procedure. The software to execute this procedure is again already contained in the controller 24. The operator must only press a 'Start' button.

The procedures for calibrating the R, θ and Z positions of the wafer at the cassette 30 and the process station 32 are similar with the exception of the sensors used. The precise type of sensor is not critical, only that it be able to detect when an object is placed in front of it. Prior to starting the autocalibration procedure, nominal or rough R, θ and Z approximation pick-up and drop-off positions of wafers at process stations and cassettes must be known. These values will already be contained in the memory of the controller. A relatively loose tolerance (e.g. plus or minus 0.5 inches) is allowed for these nominal values. The autocalibration procedure for the process station 32 is described first.

Based on the known nominal stations positions, the programmed controller 24 first commands the robot 34 to move into a position where the robot laser sensor 44 can perform a rough Z-direction scan of the vertical reference plane 61 on the station (see FIG. 3). Because this initial scan will be within the laser range of operation, but not necessarily at the optimum scanning distance, it will be used only as a rough Z calibration of the station. Since the laser sensor 44 is on the back of the wand 40, the robot arm must be backed into the station to use the laser. Therefore, the θ position ($\theta_{init}$) commanded by the controller 24 is first offset from the nominal ($\theta_{nom}$) by 180°, and the wand 42 is pivoted into the position, $\theta_{init}=\theta_{nom}+180$, as shown.

The initial R position ($R_{init}$) for the wand during the rough-Z scan is calculated by the controller 24 based on the known geometry of the station 32, the robot wand dimensions, and the nominal R position ($R_{nom}$). The initial R position ($R_{init}$) is related to the nominal R ($R_{nom}$) position by the following equation using the dimensions shown in FIGS. 2A and 3A.

$$R_{init}=-(R_{nom}+d_2+d_3-d_9-d_{10})-(d_1+d_{11})$$

Here, $R_{nom}$ is roughly the position where point E (FIG. 2A) of the wand will coincide with the center position 74 (FIG. 3A) of the wafer at the station 32 (assuming the nominal theta (θ) position is used). $R_{nom}+d2+d_3$ is therefore the position where point B is at the same position. $R_{nom}+d_2+d_3-d_9-d_{10}$ is then the position where B lies over the edge of the reference plane. If this term is negated, point B is again over the edge of the reference plane when the angle theta is offset by 180° relative to the nominal theta, as mentioned above. Now subtracting $d_1+d_{11}$ (the optimum scanning distance, FIG. 8) puts the point C on the laser at approximately the optimal scanning distance from the reference plane 61, subject to errors in the nominal position.

The initial commanded Z position ($Z_{init}$) is offset from the nominal Z($Z_{nom}$) by a sufficiently safe distance to clear the upper or top edge 62 of the frame 56 at the reference plane:

$$Z_{init}=Z_{nom}+d_6+d_5+(\text{error term})$$

The nominal Z is the approximate pickup position of a wafer within the process station 32, so adding the distances $d_6$ and $d_5$ (FIG. 3) along with some small error term places the robot safely above the frame 56 of the process station.

Once the initial scanning position is reached, the controller 24 commands the robot 34 to move the wand down in the Z-direction until the controller detects that the laser input state has turned 'on'. This indicates that the upper edge 62 of the frame 56 has been detected by the laser. When this occurs, the controller immediately records the Z position ($Z_{meas}$) The rough Z($Z_{rough}$) calibration is then calculated by the controller as:

$$Z_{rough}=Z_{meas}-d_5-d_6/2$$

This rough Z calibration safely defines the Z position where the wand 42 can be placed into the slot opening 58 for the R and θ calibration described below.

To perform the R and θ calibration the controller commands the robot 34 to move to the rough Z calibration position and to the nominal R and θ positions so the wand will be within the process station opening 58 (see FIG. 4). The vertical thrubeam sensor 68 is at a known radial distance ($d_9$) from the desired center position 74 of a wafer to be placed in the station and is at the same θ position as the desired center of the wafer. When the wand 42 is placed into the slot 58, the vertical sensor 68 is initially blocked and the controller initially reads the sensor to be 'off'.

The controller 24 then commands the robot wand 42 to move in the positive θ direction until the controller 24 reads that the sensor state has turned 'on' and the wand is clear of the sensor 68. The controller immediately records this θ position ($\theta_1$) as the position of point F in FIG. 2A and stops the robot. The robot is then commanded to move in the negative θ direction until the controller 24 reads that the sensor 68 first turns 'off,' meaning the wand 42 is again in the sensor beam, and then turns 'on,' meaning the wand has cleared the sensor beam on the other side of the wand at point G. The controller again stores the new θ position ($\theta_2$) at the sensor 'on' location as the position of point G (FIG. 2A). The controller then averages the two positions ($\theta_1$ and $\theta_2$) to define the calibrated θ position where the sensor is at the center of the wand and therefore the calibrated θ position ($\theta_{cal}$) of the wafer at the station, $\theta_{cal}=(\theta_1+\theta_2)/2$.

With the θ calibration complete, the R position can now be calibrated. With the wand 42 still in the slot, the controller 24 commands the robot 34 to move the wand 42 to the $\theta_{cal}$ position so that the vertical sensor 68 is again blocked and located along the centerline of the wand. The controller retracts the robot R axis until the sensor 68 turns on and the wand is again clear of the sensor. The controller stops the axis and captures the R position ($R_{meas}$) when the sensor state change occurs as the position of point D (FIG. 2A). The calibrated R position ($R_{cal}$) is then given by:

$$R_{cal}=R_{meas}+d_9-d_3$$

Here adding $d_9$ (FIG. 3A) to the measured position places point D at the desired center location 74 of the wafer, and subtracting d3 places point E, the point on the wand where the center of the wafer should sit, at the desired center location of the wafer.

The final measurement at the process station uses the robot laser to perform the final Z calibration. As described during the rough Z calibration, the controller 24 commands the robot 34 to move such that the laser sensor 44 is again facing the vertical reference plane, as shown in FIG. 3, although now the calibrated position for R and θ are used in the calculations. For the Z axis, the rough calibration position is used so that the laser sensor 44 is facing within the slot opening 58. The sensor face is now positioned by the controller to be exactly at the optimum scanning distance from the reference plane 61 at the face of the process station 32 since the R position has been calibrated. The controller moves the robot down in the Z direction until the lower edge 65 of the slot 58 is detected by the wand sensor. The Z position ($Z_{meas}$) at which the laser detects the lower edge 66 is captured by the controller. The calibrated Z position is then $$Z_{cal}=Z_{meas}+d_7+d_{13}(\text{laser/wand offset})$$

Here adding $d_7$ (FIG. 34), the distance between the wafer and the surface 63 of the process station, places the laser at the desired pickup height of the wafer, and adding $d_{13}$, the laser/wand offset (see FIG. 2B), then places the wand at the precise pick up or placement height for a wafer within the process station, as shown in FIG. 5.

The procedure for measuring the wafer positions at the cassette 30, as shown in FIGS. 6 and 6A is very similar to that used for the process station 32, with the exceptions that a reflective LED sensor 86 is used in place of the thrubeam sensor 68, and the constants used in the calculations are somewhat different. As before, nominal R, θ, and Z pick up and drop off positions of the wafers in the cassettes are known and stored in the controller memory.

The vertical reference plane formed by the outer surface of the frontal member 84 is used in calibrating the robot for the cassette 30 which is mounted on a suitable cassette stand (see FIG. 6). The initial scan of the sensor 44 in the Z-direction roughly measures the Z position of the upper edge 85 of this plane. The starting locations for this scan ($R_{init}$, $\theta_{init}$ and $Z_{init}$) are based on the geometrical parameters, the nominal R, θ and Z positions ($R_{nom}$, $\theta_{nom}$ and $Z_{nom}$,) of the lowest wafer, and some safe error term to ensure that the sensor 44 is originally positioned and starts out above the reference surface 85.

$$\theta_{init}=\theta_{nom}+180$$

$$R_{init}=-(R_{nom}+d_2+d_3-d_8-d_{12})-(d_1+d_{11})$$

$$Z_{init}=Z_{nom},1+(\text{error term})$$

Based on the initial Z measurement ($Z_{meas}$), the R and θ calibration occur by placing the wand 42 just over the reflective sensor 86 at position $Z_{rough}$.

$$Z_{rough}Z_{meas}+(\text{small offset})$$

As the wand 42 is moved over the reflective sensor 86, the position where the sensor turns 'on' and 'off' are used in the same way as with the thrubeam sensor 68 described above. The calibration equations are now:

$$\theta_{cal}=(\theta_1+\theta_2)/2$$

$$R_{cal}=R_{meas}+d_8-d_3$$

With the R and θ calibration complete, the Z calibration again occurs with the laser sensor 44 at the optimum scanning distance and just above the reference edge 85 at $Z_{rough}$. The measured edge position and the other parameters determine the calibration position of the lowest wafer, as shown in FIG. 6:

$$Z_{cal}=Z_{meas}+d_4+\text{laser/wand offset }(d_{13})$$

The R and θ positions of all the wafers in the cassette are the same, and the Z positions are multiples of the wafer spacing from the lowest wafer. Thus, the robot can be readily programmed to remove or place wafers in any or all of the cassette slots 80, as shown in FIG. 7.

In FIG. 11, a flow chart is provided which sets forth the sequential steps for the automatic calibration system according to the present invention. Using state of the art procedures, the machine controller 24 may be readily programmed to accomplish the aforesaid steps. The controller itself may be of any suitable type such as shown in U.S. Pat. Nos. 4,639,884 and 5,062,064.

As shown in FIGS. 1 to 4, the robot 34 is provided with sensor 44 on its wand 42 to provide a means for determining the Z position at each processing station 32 in the manner described. If a mapping function for the robot is not required, a modified and less expensive robot can be utilized which can be the same as robot 34 but does not have a sensor 44 on its wand segment.

In FIG. 4A a secondary embodiment a robot 34A is shown which is utilized in conjunction with a processing station 32A having a horizontal thrubeam type laser sensor 69 that is mounted in a frame 56A that surrounds the process station opening 58A. This sensor 69 comprises an emitter element 94 which transmits a beam horizontally across the opening 58A to an aligned receiver element 96. When the beam between these two elements is blocked, a sensor signal is generated and furnished to the controller 24. In the processing station 32A as shown typically in FIG. 4A, the horizontal thrubeam sensor 69 is provided with its elements at opposite ends of the rectangular opening 58A.

Here, the horizontal sensor 69 enables the robot 34A to determine the precise Z position in the following manner, with this alternate method, a rough Z position calibration is not required because the nominal Z position stored in the controller memory is made sufficiently accurate to perform the θ and R calibrations. Thus, with the robot wand 42A positioned in the vertical thrubeam θ and R calibrations are accomplished as previously described above. The horizontal sensor 69 is now used for the final Z calibration. After the R and θ calibrations have been accomplished, while the robot wand is still within the slot opening of the process station, the controller commands the robot 34A to move in the vertical direction until the horizontal sensor beam across the opening of the process station is touched. The position of the wand as this occurs is combined with the known vertical offset between the sensor beam and the desired Z calibration position. In this case, the upper surface of the wand is measured directly as it impinges the horizontal beam so no notion of the laser-wand offset is required. In summary, the sequence of operations for this alternate method comprises: (1) performing the θ calibration using the vertical thrubeam sensor 69; performing the R calibrations using the same vertical thrubeam sensor 68 as step 2; and making the final Z calibration using the horizontal thrubeam 69.

After the aforesaid calibration steps have been accomplished, the precise positioning data is stored in the controller memory and the robot wand 42A continues to remove or place a wafer within the process station as programmed.

To those skilled in the art to which this invention relates, many changes in construction and widely differing embodiments and applications of the invention will make themselves known without departing from the spirit and scope of the invention. The disclosure and the description herein are purely illustrative and are not intended to be in any sense limiting.

What is claimed is:

1. In combination with a robot having an arm with a wafer holding wand at its outer end, motor means for moving said arm vertically in a Z axis, rotatably about the Z axis in an angle θ and for extending said wand radially along an R axis, a system for automatically controlling said robot to cause said wand to be positioned precisely within the opening of a fixed enclosure near said robot so that it can repetitively place a semiconductor wafer within or remove it from said enclosure, said system comprising;

a machine controller having a memory and logic circuitry and connected to said robot, said controller having stored dimensional characteristics of said wand and said enclosure;

an I/O component and a motor amplifier connected to said machine controller;

first sensor means for producing signals to said controller for causing said robot wand to be moved to a vertical Z axis position relative to said enclosure opening; and second sensor means within said fixed enclosure for producing signals to said controller that cause said robot wand to move automatically in θ and R directions so as to arrive at a precise position within said fixed enclosure to thereby enable said wand to pick up or drop off a wafer at said precise position.

2. The control system of claim 1 including means within said machine controller responsive to a first programmed signal for moving said wand to an approximate location relative to said enclosure;

means responsive to signals from said first and second sensors coupled with said dimensional characteristics of said wand and said enclosure which are stored within said controller memory for causing said robot motor means to move said wand automatically through a series of scanning maneuvers and ultimately within said enclosure to a desired location therein;

whereby the end position of said wafer holding wand is precisely referenced to a predetermined location within said enclosure.

3. The system of claim 1 wherein said fixed enclosure comprises a semiconductor process station having a frontal frame member forming an elongated horizontal opening, said frame member being attached to a base member having a planar upper surface.

4. The system of claim 3 including a plurality of spaced apart support pins of equal height attached to said base member and extending above its upper surface for supporting a wafer within said enclosure.

5. The control system of claim 1 wherein said first sensor means comprises a laser sensor on said robot wand, said wand being rotatably attached to the end of said robot arm.

6. The control system of claim 5 wherein said first sensor means is attached to the rear end of the rotatable robot wand, said wand having a wafer retaining means on its opposite front end.

7. The control system of claim 5 wherein said second sensor means comprises a thrubeam sensor device having emitter and receiver elements mounted in said frame for producing a vertical beam across said opening.

8. The control system of claim 7 wherein said emitter and receiver elements are located in said frame so that the beam between them intersects a line extending through a horizontal mid-point of said opening and the desired center axis of a wafer that is properly positioned with said enclosure.

9. The control system of claim 4 wherein said first sensor means comprises a horizontal thrubeam sensor having emitter and receiver elements that are horizontally aligned and mounted in opposite end portions of said frame to provide a beam which extends horizontally across said opening.

10. The control system of claim 9 wherein the beam produced by said horizontal thrubeam sensor is in a horizontal plane above a horizontal plane above a horizontal plane formed by the upper ends of said wafer support pins.

11. The control system of claim 1 wherein said fixed enclosure comprises a wafer cassette having a plurality of wafer retaining slots, a base member for supporting said cassette and frontal members fixed to said base member having a horizontal edge located below the lowermost slot of said cassette.

12. The control system of claim 11 wherein said second sensor means comprises a reflective beam sensor device mounted at the horizontal mid-point of said frontal member for sensing the presence of said robot wand when it moves above said mid-point.

13. The control system of claim 12 including means in said controller for programming said robot to determine θ and R positions of said wand which enable said wand to place a wafer within or remove a wafer from any selected slot of the cassette relative to a virtual center axis of the cassette.

14. The control system of claim 13 wherein said means for programming include signals from said first and second sensors and dimensional characteristics of said wand and said cassette.

15. A method for automatically calibrating the positioning of a wafer handling robot wand to a desired location within an enclosure forming a process station and having elongated opening, said robot having an articulated arm that is movable in the vertical (Z), angular (θ), and radial (R) directions and is connected to a controller having memory and logic sections, said robot wand being rotatable at the end of said arm and having a first sensor at one end thereof and said process station having a second sensor within the opening of said enclosure, said method including the steps of:

1—providing said controller memory with dimensional characteristics of said wand and said process station;

2—programming said controller to cause said robot to move in a series of sequential movements;

3—rotating said wand 180° so that said first sensor faces said opening of said process station;

4—causing said robot to move in the Z direction to determine one edge of said station opening and providing its measurement as a rough Z ($Z_{rough}$) calibration to said controller;

5—returning said robot wand to a preset normal position;

6—moving the robot to an initial calibration position within said opening using said second sensor within said enclosure;

7—moving the wand in first one angular (theta) direction and then in the opposite angular direction within said enclosure to determine the desired $\theta_{cal}$ position for the wand;

8—moving the wand to the initial calibration position based on $R_{non}$, $\theta_{cal}$ and $Z_{rough}$;

9—moving the wand in the negative R direction until said second sensor is activated;

10'defining the Rcal distance by combining the R sensed position with the stored enclosure dimensions;

11—moving the wand to the initial calibration position with its sensor spaced from the enclosure opening based on $R_{cal}$, $\theta_{cal}$ and $Z_{rough}$;

12—moving the robot wand in the negative Z direction;

13—measuring the Z position when the wand sensor passes a horizontal inner edge of the opening;

14—defining the $Z_{cal}$ position by adding dimensional values of the wand and enclosure.

15—returning the wand to its normal position;

16—moving the wand into the station opening to the position defined by $Z_{cal}$, $\theta_{cal}$ and $R_{cal}$.

16. The method of claim 15 wherein said first sensor is a laser reflective sensor connected to said controller.

17. The method of claim 15 wherein said second sensor is a thrubeam sensor which provides a vertical beam across said enclosure opening at its horizontal mid-point.

18. A method for automatically calibrating the positioning of a wafer handling robot wand to a desired location within an enclosure forming a process station and having an elongated opening, said robot having an articulated arm that is movable in the vertical (Z), angular (θ), and radial (R) directions and is connected to a controller having memory and logic sections, said process station enclosure having a first sensor that provides a horizontal beam across mid opening and a second sensor that provides a vertical beam across said opening at its mid-point, said method comprising the steps of:

1—moving the robot arm manually to a rough Z and R position with said wand extending through said opening;

2—moving the wand in an angular direction to a first position and then in the opposite direction relative to said second sensor to record θ, and θ₂ positions to determine the desired $\theta_{cal}$ position for the wand;

3—moving the wand in a negative R direction to activate said second sensor;

4—defining the $R_{cal}$ distance by combing the R sensed position with the enclosure dimensions;

5—moving the wand in the negative Z direction to engage the horizontal beam of the first sensor to provide a signal to the controller;

6—using the signal from the first sensor and stored dimensional values of the wand and the enclosure to determine $Z_{cal}$ position for the wand; and 7—moving the wand into the enclosure opening to the position defined by $Z_{cal}$, $\theta_{cal}$ and $R_{cal}$.

* * * * *